(12) United States Patent
Stolzenberg et al.

(10) Patent No.: US 12,185,503 B2
(45) Date of Patent: Dec. 31, 2024

(54) COOLING DEVICE FOR COOLING BY MEANS OF A COOLING FLUID

(71) Applicant: OSRAM GmbH, Munich (DE)

(72) Inventors: Werner Stolzenberg, Berlin (DE); Ulrich Hartwig, Berlin (DE)

(73) Assignee: OSRAM GMBH, Munich (DE)

( * ) Notice: Subject to any disclaimer, the term of this patent is extended or adjusted under 35 U.S.C. 154(b) by 232 days.

(21) Appl. No.: 17/894,976

(22) Filed: Aug. 24, 2022

(65) Prior Publication Data
US 2023/0067477 A1 Mar. 2, 2023

(30) Foreign Application Priority Data
Sep. 1, 2021 (DE) .................... 10 2021 122 582.5

(51) Int. Cl.
*H05K 7/20* (2006.01)
(52) U.S. Cl.
CPC ..... *H05K 7/20509* (2013.01); *H05K 7/20272* (2013.01)
(58) Field of Classification Search
CPC ........... H05K 7/20509; H05K 7/20272; H05K 7/20254; H01L 23/473
USPC ...................................................... 165/80.3
See application file for complete search history.

(56) References Cited

U.S. PATENT DOCUMENTS

| 4,614,227 A * | 9/1986 | Vogel ............... H01L 23/473 257/E23.098 |
| 5,186,238 A * | 2/1993 | del Puerto ....... H01L 21/67109 324/750.08 |
| 2007/0030655 A1 | 2/2007 | Bhatti et al. |

FOREIGN PATENT DOCUMENTS

| CN | 102394230 A | 3/2012 |
| DE | 112005003325 T5 | 2/2008 |

* cited by examiner

*Primary Examiner* — Steve S Tanenbaum
(74) *Attorney, Agent, or Firm* — ArentFox Schiff LLP

(57) ABSTRACT

Disclosed herein is a cooling device, comprising a cooling plate and a cooling cap, for cooling a heat source, mounted to an outer interface surface of the cooling plate, by means of a cooling fluid. Several spiral-shaped fins are integrated into the cooling plate to form a structure in the shape of a multi-spiral. The fins are arranged next to each other in a mutual distance to form spiral-shaped flow channels for a cooling fluid. An inlet for inflowing the cooling fluid at the center of the multi-spiral fins structure is integrated into the cooling cap. The cooling cap is configured and arranged on the cooling plate so that the inlet is positioned above the center of the multi-spiral fins structure.

15 Claims, 5 Drawing Sheets

COOLING DEVICE FOR COOLING BY MEANS OF A COOLING FLUID

CROSS-REFERENCE TO RELATED APPLICATIONS

The present application claims priority to, and the benefit of, German Patent Application No. 10 2021 122 582.5 filed Sep. 1, 2021, the contents of which are hereby incorporated by reference in their entireties.

The present disclosure relates to a device for cooling of heat sources, particularly of high-power density heat sources, by means of a cooling fluid. Such kind of heat sources may comprise, amongst others, high power packages of LEDs, e.g. UVA LED arrays, VCSELs, LDs, electronic regulators, e.g. linear regulators, power transistors, beam targets, e.g. for radioisotope or neutron production, beam dumps. In particular, the present disclosure relates to a device for cooling of high-power electronic devices, notably high-power opto-electronic semiconductor components and modules.

The cooling device and the respective heat source are closely arranged to enable effective heat transmission from the heat source to the cooling device. The cooling fluid inside the cooling device transports the heat away from the heat source and finally outside the cooling device, e.g. by connecting to a cooling fluid reservoir or a heat exchanging device.

In the prior art so-called micro channel coolers are known. These coolers are usually build-up by stacking punched metal foils. These foils are usually made of copper and joint by introducing silver (Ag) between the foils and finally sintering or soldering. The stack is shaped in a three-dimensional structure such that a cooling liquid can flow through the structure, thereby carrying away the heat generated by a heat source.

The document U.S. Pat. No. 4,614,227 A discloses a cooling body for the liquid cooling of high-power semiconductor components mounted to the cooling body. The disc-shaped cooling body comprises cooling slits formed in the shape of a spiral. A cooling liquid from a cooling liquid reservoir flows through the spirally shaped cooling slits.

Because of the structure of prior art cooling devices, the pressure drop can become an issue at high volume flow of the cooling liquid.

In view of the continuing development of electronic devices with ever higher power densities, there seems to be a constant need in the industry to improve various aspects of such cooling devices.

It is an object of the present disclosure to provide an improved cooling device for heat sources with high heat power densities.

It is another object of the present disclosure to provide a cooling device that enables a low temperature difference between heat source and cooling fluid, for example, less than about 35° C.

It is yet another object of the present disclosure to provide a cooling device that has a low thermal resistance.

According to the present disclosure, one or more of the above-mentioned objects are achieved by a cooling device according to the features of present claim 1.

Embodiments and developments of the cooling device, hereinafter also referred to as cooler, are defined as the dependent claims and are the subject matter of the description and the drawings.

Various embodiments of the cooling device disclosed herein comprise several spiral-shaped fins arranged next to each other in a mutual distance to form a structure in the shape of a multi-spiral. Adjacent fins constitute walls of spiral-shaped flow channels extending between adjacent fins. Each flow channel may be regarded as an "arm" of the multi-spiral structure, similar to the arms of a spiral galaxy. The distance between adjacent fins defines the width of the respective flow channel. The number of fins may typically range from three to eight, preferably from four to six. The number of flow channels is identical to the number of fins, because each fin constitutes a wall for two flow channels, one channel on the left of a fin and one on the right, due to the specific rotational symmetry of the multi-spiral structure. In other words, each fin separates two neighboring flow channels. The flow channels are intended for carrying a cooling fluid.

The spiral shape of the fins has the advantage of a self-supporting characteristic, enabling very small thicknesses of the fins, particularly when compared to radially arranged and linearly shaped fins. This allows for very thin and high fins, which in turn enable to increase the distance between fins and, hence, the flow channel width without sacrificing the compact special dimensions of the structure. Thin and high fins and appropriate channel widths contribute to a low pressure drop of the cooling system and a low thermal resistance at the same time. Furthermore, due to larger channel structures compared to micro-channel coolers clogging of the cooling structure is less likely. Therefore, the thickness T of the fins is smaller than the distance between adjacent fins, i.e. smaller than the width W of the respective flow channel, preferably several times smaller, typically in the range from 4 to 10 times smaller. Furthermore, the height H of the fins is larger than the thickness T of the fins, preferably several times larger, typically in the range from 6 to 20 times larger. The height H of the fins corresponds to the depth D of the flow channels. Preferably, all fins meet in the center of the multi-spiral structure. This has the advantage that the stability of the multi-spiral structure is even more increased.

The inflow for the cooling fluid of the cooling device is arranged vis-à-vis or adjacent the center of the multi-spiral structure in such a way that the fluid enters each flow channel. From the central inflow cooling fluid flows through each flow channel and outflows at its respective end. The other side of the multi-spiral structure, opposite to the central inflow, is designed to be in contact with the heat source, i.e. is the active cooling region. Due to the inflow of the cooling fluid in the center of the cooler, the heat is transported particularly well in the center of the cooler. This is the area with the highest heat flux and thus the highest temperature. Furthermore, the boundary layer is decreased due the central inflow. These measures enable a more homogeneous temperature profile of a heat source, e.g. an LED array, when attached to an interface surface of the active cooling region of the disclosed cooling device.

In a preferred embodiment, the fins are shaped to taper in a direction away from the heat source and the bottom of the flow channels, i.e. perpendicular to the plane in which the spiral arms extend. In other words, the thickness of the fins gradually decreases starting from the bottom of the multi-spiral structure, which is in contact with the heat source, up to the top of the fins, i.e. with increasing distance from the heat source. The advantage of the tapered cross-sectional shape of the fins is twofold. First, the thicker base part of the tapered profile enables a better heat transfer from the heat source into the fins. Second, the tapered profile results in a gradual increase of the distance between adjacent fins, i.e. an increasing channel width from base to top. This in turn results in a reduction in the pressure drop of the cooler.

In some embodiments, the fins may have small cutout, enabling parts of the fluid to take "short cuts" through the multi-spiral structure. This measure has the advantage of further reducing the pressure drop of the cooler.

In some embodiments, the multi-spiral fin structure is shaped or integrated into a cooling plate, constituting the active cooling region of the cooling device. A heat source may be arranged adjacent to, preferably in close contact to an interface surface of the active cooling region. For the cooling plate a material with a high thermal conductivity is used. Preferably, a material is used that has a thermal conductivity of at least 150 W/m/K, e.g. aluminum (Al), more preferably at least 300 W/m/K, e.g. pure copper (Cu). Furthermore, the material thickness in the active cooling region, i.e. between the bottom of the flow channels and the outer surface of the cooler intended for contact with a heat source (interface surface of the cooling device), is as thin as possible to further reduce the thermal resistance between heat source and cooling fluid. Preferably, the material thickness is less than 0.6 mm, more preferably less than 0.4 mm.

According to at least one embodiment, the cooling device comprises an inlet and an outlet for providing the inflow and outflow of the cooling fluid, respectively. The fluid inlet and the fluid outlet can be connected to a cooling fluid reservoir. Further peripheral equipment may comprise a pump for circulating the cooling fluid to and from the cooling device, a recuperator or heat recovery system, a chiller, etc. The inlet is configured and arranged such that the cooling fluid is guided into the center of the multi-spiral fin structure and from there all the way through the spiral-shaped flow channels defined between adjacent fins. Furthermore, a drain is provided to collect the cooling fluid after passing the multi-spiral fin structure and guide it to the outlet.

Suitable cooling fluids may comprise, for example, water, alcohol, liquid nitrogen. Additives like glycol, e.g. ethylene or propylene glycol, may be added to water to prevent biofilms.

To reduce the viscosity and increase the specific heat of the fluid, two phase (liquid/gas) nucleation, i.e. bubble formation, can be forced by introducing pressure variation, e.g., due to mechanical vibrations induced by a piezo actuator. Also, ultrasonic movements of the fins may be induced by such an actuator to increase the volume flow near the fins and thus improve the heat exchange between the fins and the cooling fluid.

In some embodiments, the cooling device comprises a lower section or cooling base and an upper section or cooling cap. The cooling base comprises the cooling plate and the multi-spiral fin structure. Preferably, the multi-spiral fin structure is integrated into the cooling plate. The cooling cap comprises the inlet and the outlet for the cooling fluid and a drain. The inlet is configured to guide the inflowing cooling fluid into the center of the multi-spiral fin structure. The drain collects the cooling fluid outflowing from the multi-spiral fin structure and guides it to the outlet.

The cooling base and the cooling cap may be two separate parts of the cooling device. Preferably, the cooling base is constructed to shape the cooling plate with an integrated multi-spiral fin structure. A two-parts embodiment of the cooling device has the advantage that conventional manufacturing methods like milling can be used. The two parts, cooling base (i.e. cooling plate with integrated multi-spiral fin structure) and cooling cap, may be joint in a leakproof manner by means of a gasket or by means of soldering, gluing, sintering.

Alternatively, the cooling base and the cooling cap may be elements of a one-piece cooling device. An integral embodiment of the cooling device may be manufactured by means of 3D printing methods. 3D printing also enables fast prototyping and, thus, field-testing instead of simulating for optimizing the cooling device for specific purposes. In any case, the cooling device is easily adaptable and scalable to meets different requirements.

A cooling device designed according to the present disclosure can handle high heat power densities, e.g. values in the order of about 10 W/mm$^2$ or even more, providing several advantages, for instance, a low thermal resistance, a low pressure drop at high volume flow of the cooling fluid, optimized heat transfer from the center of the cooler due to the central inflow of the cooling fluid and the multi-spiral geometry of the cooler. According to simulations and measurements conducted by the inventors, an exemplary value achieved for the thermal resistance was 0.17 K/W from the cooling fluid to the junction of an LED array with a cooling area of 29.4 mm$^2$. For an exemplary heat deposition in the order of 170 W this low thermal resistance resulted in 29 K of temperature difference between heat source and cooling fluid.

These and other aspects of the invention will now be further described, by way of exemplary embodiments only, with reference to the accompanying figures, in which.

Like elements are indicated by like reference numerals. Identical or essentially identical elements may be described only with respect to the figures where they are shown first. They may not be reiterated in the description of successive figures.

Figure 1:
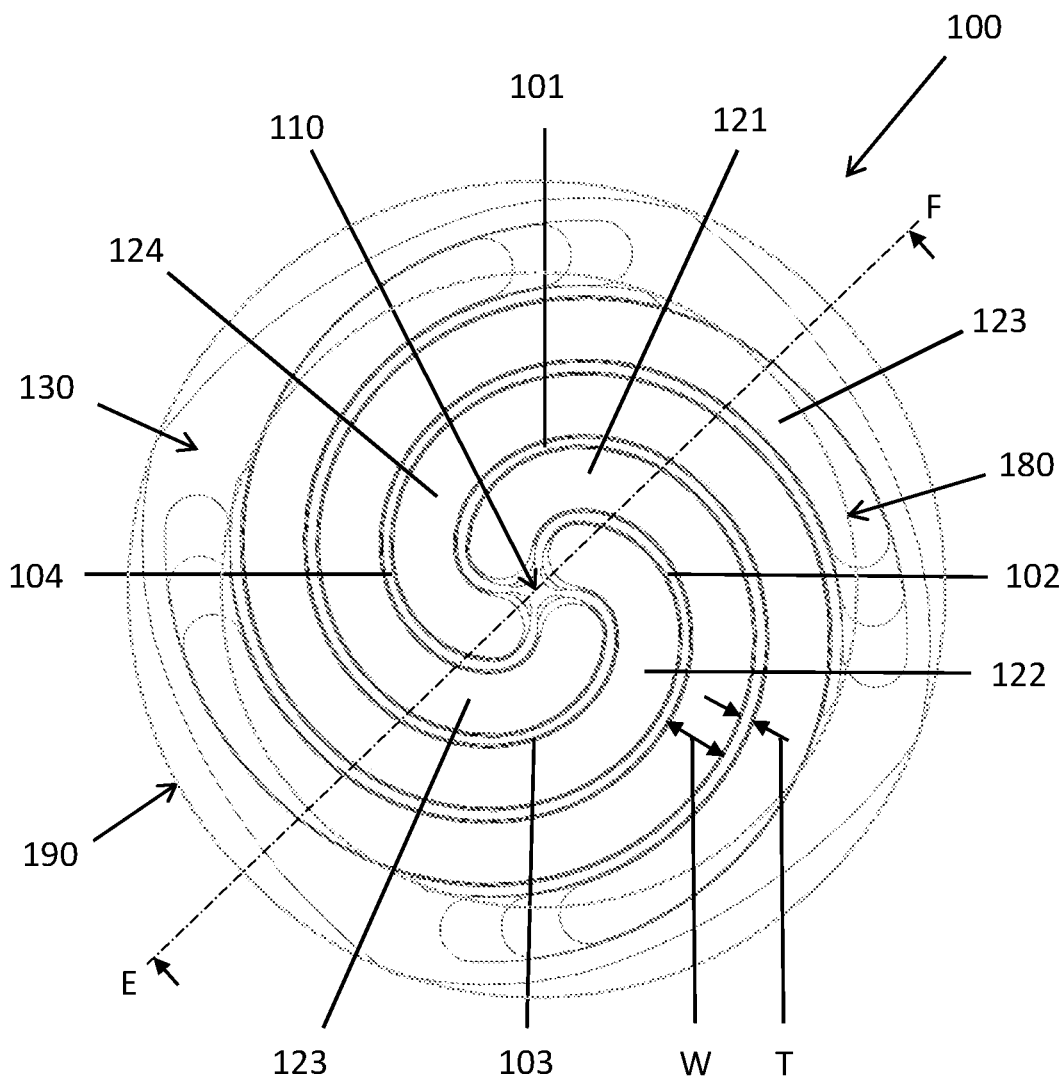
FIG. 1 shows a top view of an exemplary multi-spiral structure.

FIG. 1 shows a top view of an exemplary multi-spiral structure 100 integrated into a cooling plate 1 (not shown here; see FIG. 2) of a cooling device. The multi-spiral structure 100 comprises four spiral-shaped fins 101, 102, 103, 104. All four fins 101-104 are connected at the center 110 of the multi-spiral structure forming four separate flow channels 121, 122, 123, 124 for a cooling fluid. Each of the flow channels 121, 122, 123, 124 starts from the center 110 of the spiral structure 100 and ends in a first drain region 130. The first drain region 130 is arranged in the peripheral area of the spiral structure 100. The first drain region 130 is dedicated to collect the cooling fluid after passing through the multi-spiral fin structure 100 and direct it into a second drain region 211, a third drain region 212 and finally an outlet 201 integrated in a cooling cap 2 (not shown here; see FIGS. 4A, 4B) of the cooling device 3. The circumference of the active cooling region 180 (symbolized by the inner dotted circle excluding the drain region 130) is designed to match the surface of the heat source 300 (not shown here; see FIG. 2) to be cooled. It can also be slightly larger than the respective surface of the heat source, preferably less than 120% of the heat source circumference, to keep the fin and flow channel length and thus the pressure loss as small as possible. The circumference 190 of the exemplary multi-spiral structure 100 including the drain region 130 (symbolized by the outer dotted circle) is 5 to 90 mm, preferably 15 to 30 mm. The thickness T of the fins may range from 0.1 to 0.8 mm, preferably from 0.2 to 0.4 mm. The distances between adjacent fins, 101-102, 102-103, 103-104, 104-101, i.e. the channel widths W, may range from 4/n mm to 12/n mm, preferably from 6/n to 8/n mm, n being the number of fins. Of course, these values may vary slightly along the fins due to limited manufacturing accuracy. As to the exemplary multi-spiral structure 100 shown in FIG. 1, the number n of fins is four resulting in typical channel widths W in the range of approximately 1 mm to 3 mm, preferably 1.5 mm to 2 mm. In the peripheral region of the multi-spiral structure 100, essentially outside the active cooling region 180, the depths D of the flow channels are stepwise reduced (for more details see FIG. 3 and corresponding description).

Figure 2:
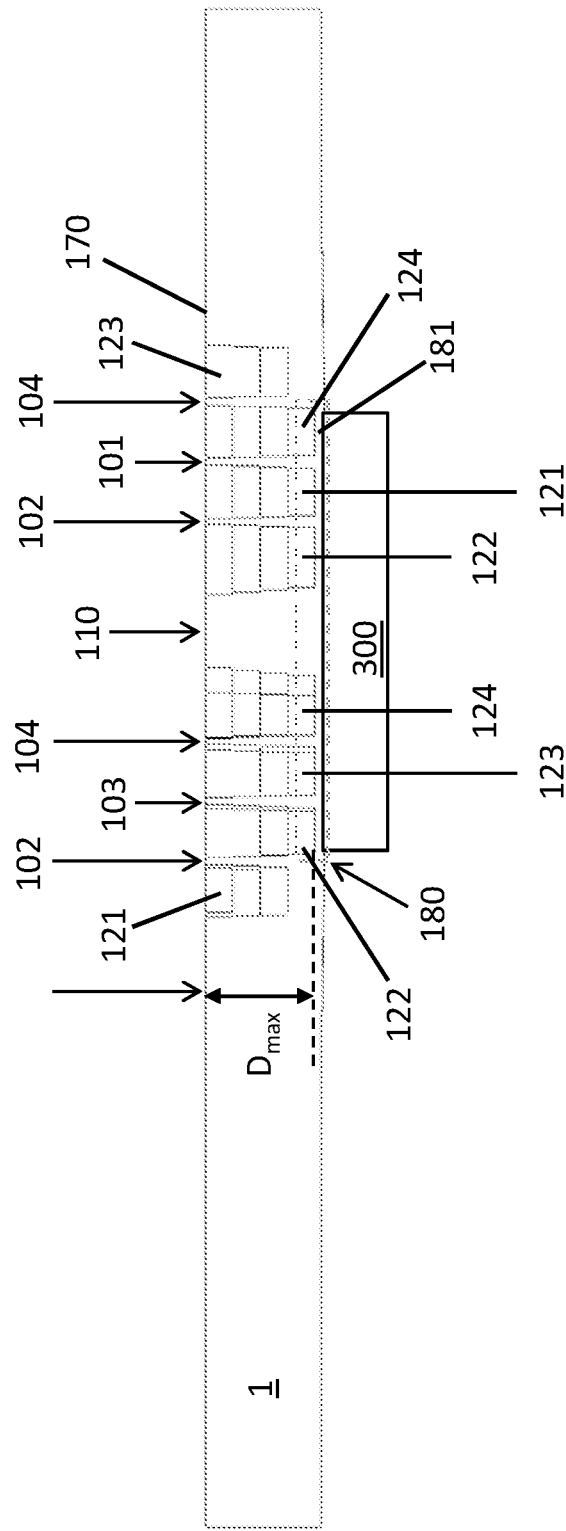
FIG. 2 shows a side view of a cross section of an exemplary cooling plate with a multi-spiral structure according to the example of FIG. 1.

FIG. 2 shows a side view of a cross section of an exemplary cooling plate 1 with a multi-spiral structure according to the embodiment of FIG. 1. Below the multi-spiral structure is the active cooling region 180 (symbolized by a dashed line). A schematically depicted heat source 300 is attached to an interface surface of the active cooling region 180. For example, the heat source 300 may be an LED module, which is driven by high current electrical supply, particularly a UV-A or UV-C emitting LED module. Such an LED module typically comprises multiple LEDs arranged in the shape of an array.

The fins 101, 102, 103, 104 of the multi-spiral structure are integrated into the cooling plate 1. They form thin spiral-shaped walls separating the flow channels 121, 122, 123, 124 (shown in FIG. 2 is a cross-sectional view of the multi-spiral structure along the line E-F showed in FIG. 1) for the cooling fluid (not shown). In the active cooling region 180 the maximum depth $D_{max}$ of the multi-spiral structure, which correlates with the maximum height $H_{max}$ of the fins, typically ranges from approximately 2 to 8 mm, preferably 3 to 5 mm. The material thickness 181 between the bottom of the flow channels 121-124 in the active cooling region 180 and the interface surface for attaching the heat source 300 to the cooling device is typically smaller than 0.6 mm, preferably smaller than 0.4 mm, to ensure a low thermal resistance and, therefore, enable optimal cooling of the attached heat source 300. The thickness T of the fins 101-104 typically ranges from 0.1 to 0.8 mm, preferably from 0.2 to 0.4 mm. Furthermore, the thickness of the fins 101-104 is stepwise reduced from the bottom 181 to the top 170. The stepwise decrease of the thickness combines proper heat transfer, particularly towards the bottom, with reduced pressure drop of the cooling fluid, particularly towards the top.

Figure 3A:
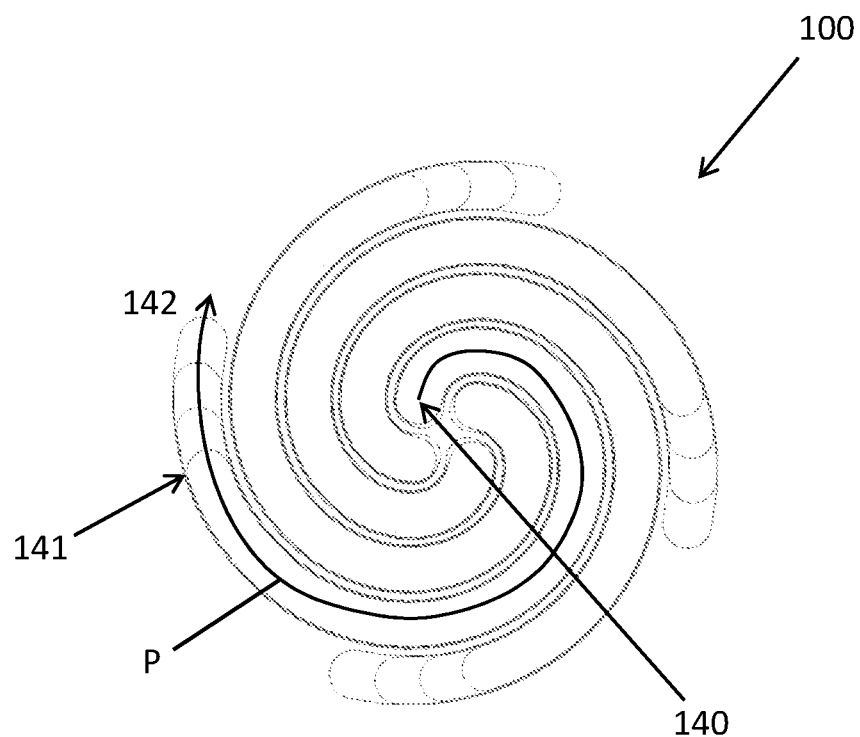
FIG. 3A shows a top view of an exemplary multi-spiral structure similar to the one shown in FIG. 1.
Figure 3B:
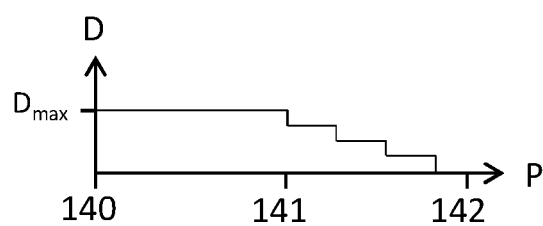
FIG. 3B shows a profile-graph of the depth D along a flow channel of the multi-spiral structure of FIG. 3A.

FIGS. 3A and 3B illustrate the stepwise reduction of the depth D of the flow channels along an imaginary path 161 in a flow channel. The imaginary path 161 starts at a point 140 near the center of the multi-spiral structure (see FIG. 3A) and extends to the endpoint 142 where the flow channel opens into the drain region 130 (not shown in FIG. 3A; see FIG. 1). The point 141 indicates the first step of reduction of the depth D. Preferably, the point 141 is outside the active cooling region 180 (not shown in FIG. 3A; see FIG. 1). In the exemplary multi-spiral structure shown in FIG. 3a the depth D is reduced in four steps. The profile-graph shown in FIG. 3B illustrates the depth D depending on the position P along the path. The four steps reduction is indicated in the section of the path P between the points 141 and 142. As an alternative to the stepwise reduction, the reduction may be formed continuously, e.g. in the shape of a slope. In any case, the gradual reduction of the depth of the flow channels has the advantage that the fluid flowing along the channels is gradually guided out of the multi-spiral structure into the drain region. Furthermore, the depth reduction reduces the pressure drop, particularly if limited space does not allow for a more generous lay out design of the multi-spiral structure.

Figure 4A:
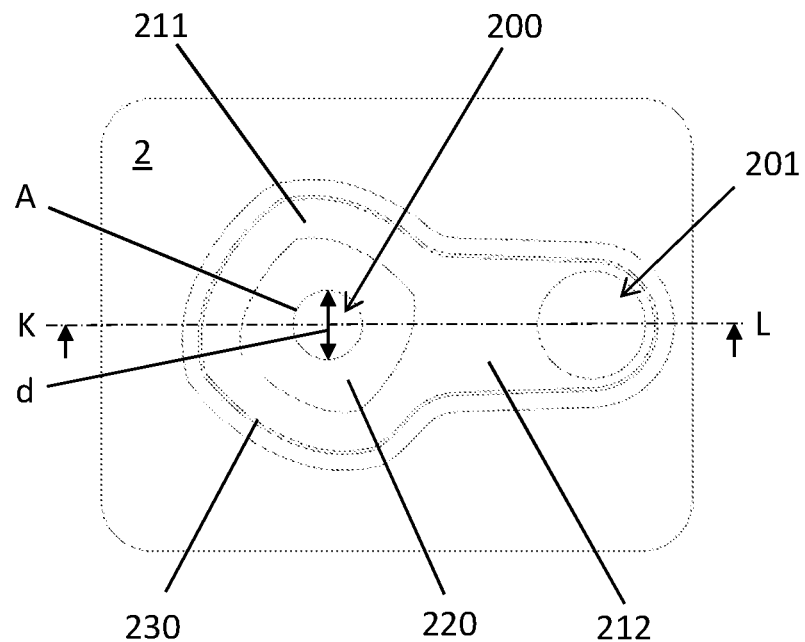
FIG. 4A shows a top view of an exemplary cooling cap of the cooling device.
Figure 4B:
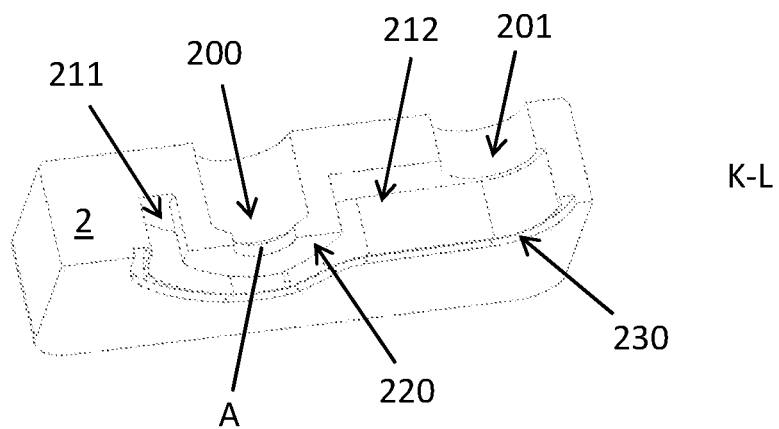
FIG. 4B shows a 3D view of a cross section of the cooling cap of FIG. 4A.

FIGS. 4A and 4B show a top view and a 3D view of a cross section along the line K-L of an exemplary cooling cap 2 of the cooling device, respectively. The function of the cooling cap 2 is to guide the flow of the cooling fluid into and out of the multi-spiral structure. For this purpose, the cooling cap 2 is configured to be arranged on the cooling plate 1 (see FIG. 2 and FIG. 5) in a fluid-tight manner. A notch 230 for a gasket seal, e.g. O-ring or cut-out rubber part, surrounds the periphery of a fluid drain region 211, extending around a cylindrical fluid inlet 200, and a fluid drain region 212, leading to a cylindrical fluid outlet 201. The fluid inlet 200 ends in a central seal 220 having an aperture A configured to ensure that the inflowing cooling fluid enters the flow channels of the multi-spiral structure via its central region close to the center 110 (see FIG. 1). Furthermore, the central seal 220 is configured to seal the top portions of the flow channels outside the central inflow region, ensuring that inside the active cooling region 180 the cooling fluid cannot flow beyond the walls of the flow channels. Outside the active cooling region 180 the central seal 220 is bordered by the circumferential second drain region 211.

Figure 5:
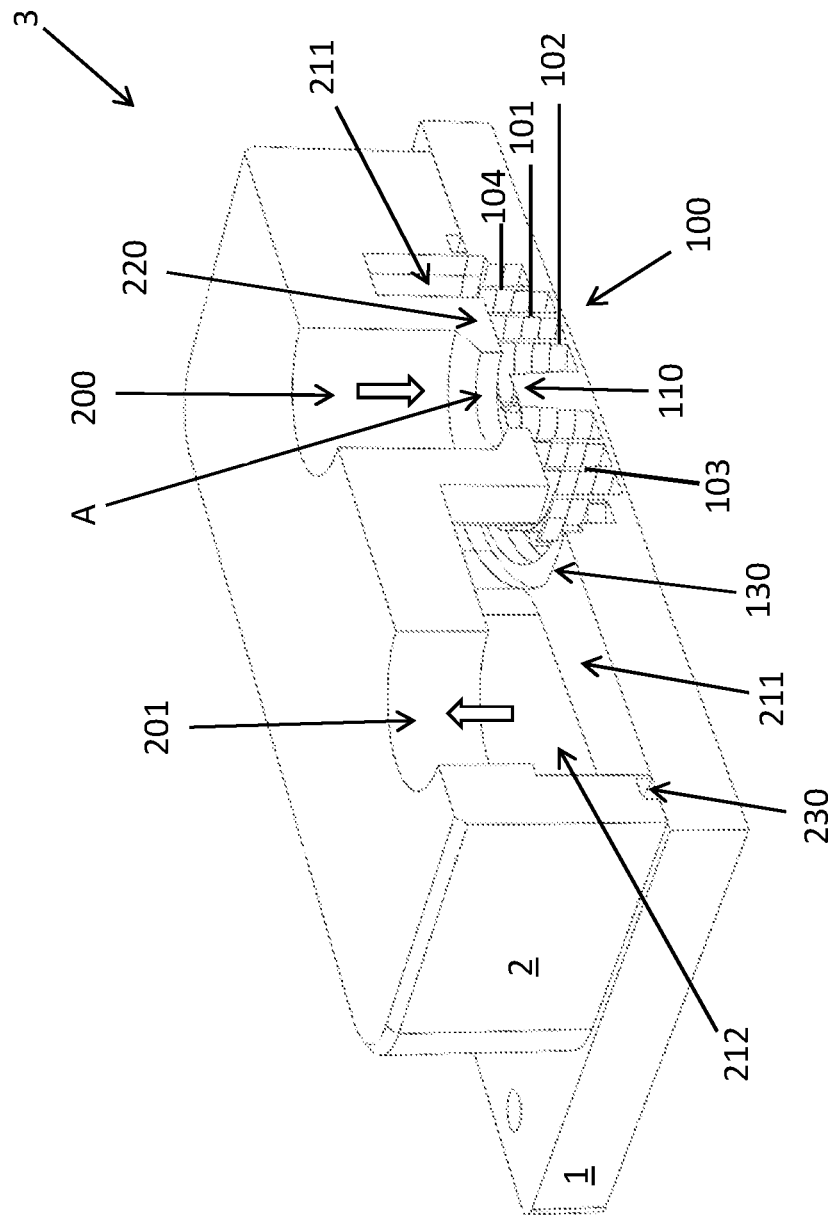
FIG. 5 shows a 3D view of a cross-section of an exemplary cooling device with a cooling plate according to FIG. 2 and a cooling cap according to FIGS. 4A, 4B.

FIG. 5 shows a 3D view of a cross section of an exemplary cooling device 3 with a cooling plate 1 according to FIG. 2 and a cooling cap 2 according to FIGS. 4A, 4B. Cooling plate 1 and cooling cap 2 are joint together, e.g. by means of screwed fastening or clamped joint (not shown). Alternative methods for connecting the cooling plate 1 and the cooling cap 2 in a leak-proof manner without the need for a gasket seal may be soldering, sintering, or gluing. After joining the cooling plate 1 and the cooling cap 2 the fluid inlet 200 is positioned concentrically to the center 110 of the multi-spiral fin structure 100. Preferably, the cross-sectional area of the aperture A at the end of the fluid inlet 200 is approximately equal to the sum of cross-sectional areas (D times W) of the flow channels 121-124. Deviations may be acceptable within a margin from −25% to +50%. The central seal 220 covers the top surface 170 of the multi-spiral structure 100 within the active cooling region 180 (see also FIGS. 1 and 2) except a circular central aperture A above the center 110 of the multi-spiral fins structure 100 for the inflowing of the cooling fluid. The sealing surface of the central seal 220 joins the top surface 170 of the fins as tight as possible, leaving a gap of preferably less than 0.1 mm, more preferably less than 0.05 mm.

In an alternative embodiment, the cooling plate with the multi-spiral structure (cooling base) and the cooling cap are integral elements of a one-piece cooling device, e.g. 3D-printed, having no gap between the elements cooling base and cooling cap at all.

In any case, the aperture A of the central seal 220 is designed to keep open vents around the center 110 through which a cooling fluid inflowing through the inlet 200 can enter the flow channels 121-124 (see FIG. 5, and also FIGS. 1 and 2), while, at the same time, ensuring that the cooling fluid is guided by the fins 101-104 of the multi-spiral fins structure 100 all the way along the flow channels 121-124 into the first drain region 130, further into the second drain region 211 (extending above the first drain region 130 and surrounding the cylindrical inlet 200 and the seal 220), further guided by the third drain region 212 (extending from the second drain region 211) that, finally, leads the cooling fluid to the outlet 201.

For supporting the cooling device with cooling fluid, the inlet and the outlet may be connected to a cooling fluid reservoir, for example, via fluid pipes that are attached to the inlet and outlet by means of respective couplings fitted therein. Instead of cooling, the cooling device is also capable of heating a device, which is attached to it, to a certain temperature by connecting the cooling device to a reservoir of preheated fluid.

Although the cooling device of the present disclosure has been described above and explained in detail by means of various embodiments that have structures in the range of millimeters or even sub-millimeters, the cooling device can easily be scaled up to larger dimensions. However, the material thickness 181 (see FIG. 2) in the active cooling region 180 should not be scaled up, but preferably kept as thin as possible. This has the advantage of a low thermal resistance and flexible interface for the junction of a heat source.

Disclosed herein is a cooling device, comprising a cooling plate and a cooling cap, for cooling a heat source, mounted to an outer interface surface of the cooling plate, by means of a cooling fluid. Several spiral-shaped fins are integrated into the cooling plate to form a structure in the shape of a multi-spiral. The fins are arranged next to each other in a mutual distance to form spiral-shaped flow channels for a cooling fluid. An inlet for inflowing the cooling fluid at the center of the multi-spiral fins structure is integrated into the cooling cap. The cooling cap is configured and arranged on the cooling plate so that the inlet is positioned above the center of the multi-spiral fins structure. After flowing through the flow channels of the multi-spiral structure the cooling fluid is collected by a drain and guided to an outlet that is integrated into the cooling cap.

LIST OF REFERENCE SIGNS 1 cooling plate
2 cooling cap
3 cooling device
100 integrated multi-spiral structure
101-104 fins
110 center of fins structure
121-124 flow channels
130 first drain region of the multi-spiral structure
140 starting point of imaginary path
141 point of first step of depth reduction
142 endpoint of imaginary path
170 top surface of cooling plate/fins
180 circumference of active cooling region
181 material thickness to the heat source
190 circumference of the multi-spiral structure including drain region
200 fluid inlet
201 fluid outlet
211 second drain region around inlet
212 third drain region leading to outlet
220 central seal of cooling cap
230 notch for gasket seal
300 heat source
A aperture of central seal of cooling cap
D depth of flow channels/multi-spiral structure
$D_{max}$ max. depth of fin/channel structure
d diameter of aperture A
$H_{max}$ max. height of the fins
P imaginary path
T thickness of fins
W channel width or distance of fins

The invention claimed is:

1. A cooling device for cooling heat sources by means of a cooling fluid, particularly for cooling heat sources with high heat power densities, comprising:
    multiple fins arranged to form a multi-spiral structure, wherein
        each fin is formed in the shape of a spiral,
        the spiral-shaped fins are arranged next to each other in a mutual distance,
        adjacent fins constitute walls of spiral-shaped flow channels for the cooling fluid, which flow channels extend between the adjacent fins, whereby
            the distance between the adjacent fins defines a width of the respective flow channel,
        each fin constitutes a wall for two neighboring flow channels;
    an inlet configured for inflowing the cooling fluid at the center of the multi-spiral structure into the flow channels; and
    a cooling plate, wherein the multi-spiral structure is integrated in the cooling plate, thereby defining an active cooling region of the cooling plate beneath the multi-spiral structure, wherein the cooling device is configured for mounting a heat source at an interface surface of the active cooling region.

2. The cooling device of claim 1, wherein all fins meet in the center of the multi-spiral structure.

3. The cooling device according to claim 1, wherein a thickness of the fins is smaller than the distance between adjacent fins, i.e. smaller than the width of the respective flow channel.

4. The cooling device according to claim 1, wherein a thickness of the fins gradually reduces from the bottom of the flow channels to the top surface of the fins.

5. The cooling device according to claim 1, wherein a thickness of the fins ranges from 0.1 mm to 0.8 mm, preferably from 0.2 mm to 0.4 mm.

6. The cooling device according to claim 1, wherein the maximum depth of the flow channels ranges from 2 mm to 8 mm, preferably from 3 mm to 5 mm.

7. The cooling device according to claim 1, wherein a height of the fins is larger than a thickness of the fins, preferably several times larger, more preferably in the range from 6 to 20 times larger.

8. The cooling device according to claim 1, wherein the inlet comprises a central seal configured and arranged on the top surface of the fins to seal the top portions of the flow channels, except a central aperture above the center of the multi-spiral fins structure for the inflowing of the cooling fluid.

9. The cooling device of claim 8, wherein the cross sectional area of the aperture at the end of the fluid inlet is approximately equal to the sum of the cross sectional areas of the flow channels, preferably within a range of deviation from −25% to +50%.

10. The cooling device according to claim 1, wherein the distance between adjacent fins ranges from 4/n mm to 12/n mm, preferably, 6/n to 8/n mm, whereby n indicates the number of fins.

11. The cooling device according to claim 10, wherein the number of fins ranges from 3 to 8, preferably from 4 to 6.

12. The cooling device according to claim 1, further comprising a drain, wherein the drain comprises a first drain region, arranged in the peripheral area of the multi-spiral structure, in which the spiral-shaped flow channels end, for collecting the cooling fluid after passing the multi-spiral fin structure.

13. The cooling device of claim 12, wherein the depth (D) of the flow channels gradually reduces in the first drain region.

14. The cooling device according to claim 12, further comprising a second drain region, a third drain region and an outlet, wherein the second drain region extends above the first drain region, surrounding the inlet and a seal, and the third drain region extends from the second drain region leading to the outlet.

15. The cooling device according to claim 14, further comprising a cooling cap arranged on the top surface of the cooling plate or extending from the top of the cooling plate, whereby the inlet, the outlet, the second drain region and the third drain region are integrated in the cooling cap.

\* \* \* \* \*